United States Patent [19]

Holonyak, Jr.

[11] Patent Number: 4,594,603
[45] Date of Patent: Jun. 10, 1986

[54] SEMICONDUCTOR DEVICE WITH DISORDERED ACTIVE REGION

[75] Inventor: Nick Holonyak, Jr., Urbana, Ill.

[73] Assignee: Board of Trustees of The University of Illinois, Ill.

[21] Appl. No.: 694,730

[22] Filed: Jan. 24, 1985

Related U.S. Application Data

[62] Division of Ser. No. 370,756, Apr. 22, 1982, Pat. No. 4,511,408.

[51] Int. Cl.⁴ .......................... H01L 33/00; H01S 3/19
[52] U.S. Cl. ........................................ 357/16; 357/17; 357/61; 357/91; 372/45; 372/46
[58] Field of Search .............. 372/45, 44, 46; 357/16, 357/17, 60, 61, 91; 148/1.5, 187, 175

[56] References Cited

U.S. PATENT DOCUMENTS 4,378,255  3/1983  Holonyak, Jr. et al. ............. 372/45

OTHER PUBLICATIONS

W. D. Laidig et al, "Quenching of Stimulated Phonon Emission in $Al_xGa_{1-x}As$–GaAs Quantum-Well Heterostructures", *Solid State Commun.* 38, #4, Apr. 1981, pp. 301–304.
W. D. Laidig et al, "Disorder of an AlAs–GaAs Superlattice by Impurity Diffusion", *Appl. Phys. Lett.* 38, May 15, 1981, pp. 776–778.
N. Holonyak, Jr. et al, "IR–Red GaAs–AlAs Superlattice Laser Monolithically Integrated in a Yellow-Gap Cavity", *Appl. Phys. Lett.* 39, Jul. 1, 1981, pp. 102–104.
S. W. Kirchoefer et al, "Zn Diffusion and Disordering of an AlAs–GaAs Superlattice Along Its Layers", *J. Appl. Phys.*, Jan. 1982, pp. 766–768.
W. D. Laidig et al, "Induced Disorder of AlAs–AlGaAs–GaAs Quantum-Well Heterostructures", *J. Electronic Matter*, 11, Jan. 1982, pp. 1–20.

*Primary Examiner*—James W. Davie
*Attorney, Agent, or Firm*—Martin Novack

[57] ABSTRACT

A semiconductor device is disclosed, which includes a disordered alloy converted from at least a first active semiconductor region and a second semiconductor barrier layer that have been disordered by introduction of a disordering element selected from the group consisting of silicon and krypton such that the alloy exhibits a higher energy gap than the first active semiconductor region.

10 Claims, 6 Drawing Figures

SEMICONDUCTOR DEVICE WITH DISORDERED ACTIVE REGION

The U.S. government has rights in this invention as a result of finacial support by NSF grants DMR 79-09991 and DMR 77-23999.

This is a divisional of copending U.S. application Ser. No. 370,756, filed Apr. 22, 1982, now U.S. Pat. No. 4,511,408.

FIELD OF THE INVENTION

This invention relates to improvements in semiconductive devices, and more particularly to a method for producing integrated light emitting semiconductor devices and to said devices. The subject matter of this application is related to subject matter of copending U.S. application Ser. No. 260,956, filed May 6, 1981, now U.S. Pat. No. 4,378,255, and assigned to the same assignee as the present application.

BACKGROUND OF THE INVENTION

Light emitting semiconductors are well known in the prior art. One of the more widely used light emitting devices is a heterojunction light emitter fabricated, for example, using a gallium arsenide/aluminum gallium arsenide material system. In such devices, a pair of relatively wide band gap layers (aluminum gallium arsenide) of opposite conductivity type are sandwiched around an active region (gallium arsenide). The interfaces between the active region and the wide band gap layers form a pair of heterojunctions. These heterojunctions effectively provide both carrier and optical confinement. The devices are generally used as light emitting diodes or lasers and may be energized using an electrical current or by optical pumping.

An improved light emitting device is described in co-pending U.S. patent application Ser. No. 209,240, now U.S. Pat. No. 4,439,782, of N. Holonyak and assigned to the same assignee as this application. Therein is described a light emitting device wherein the active region comprises one or more layers of gallium arsenide separated by aluminum arsenide barrier layers. The aluminum arsenide binary layers replace previously employed aluminum gallium arsenide ternary barrier layers for the reason that the latter ternary layers have been found to be inherently disordered and to exhibit alloy clustering in the regions adjacent to the gallium arsenide/aluminum gallium arsenide interface. That clustering leads to the device requiring larger threshold currents and exhibiting lower efficiencies. The disclosure and teachings of the aforementioned patent application are incorporated herein by reference.

Light emitting devices such as those described above are generally, although not necessarily, grown by metalorganic chemical vapor deposition ("MO-CVD"), which is described, for example, in a publication entitled "Chemical Vapor Deposition for New Material Applications", appearing in the June, 1978, issue of "Electronic Packaging and Production". Such devices are also grown by molecular beam epitaxy, liquid phase epitaxy, or other suitable deposition techniques. The MO-CVD and MBE processes are generally the preferred ones.

In all of the aforementioned processes, the light emitting devices are produced in wafer form, which wafer is then cleaved or cut to produce individual light-emitting diodes or lasers. This is in contrast to the well-known integrated circuit technology wherein large numbers of active devices are constructed and interconnected on a single chip. Such integration, heretofore, has been unavailable, on a practical basis, for the above-mentioned light emitting semiconductor devices. Attempts to integrate light emitting devices have generally been rather crude—involving the actual physical emplacement of light-emitting structures in etched-out substrates. Such a structure is shown in U.S. Pat. No. 4,165,474 to D. J. Myers.

It is clear that an economic method of integrating heterojunction light emitting devices into larger scale integrated circuits would be an important contribution to the expansion of optical data processing and data communications.

Accordingly, it is an object of this invention to provide a method which enables the integration of III–V compound heterojunction devices into an overall integrated structure.

It is another object of this invention to provide a method for constructing integrated optoelectronic devices which method is both simple and fits with present semiconductor processing technology.

SUMMARY OF THE INVENTION

In accordance with the above objects, it has been discovered that a multilayer, III–V semiconductive structure can be disordered and shifted up in energy gap, while maintaining the crystalline structure, by introduction of a disordering element, such as by diffusion or implantation. For example, all or selected portions of a multilayer of either gallium arsenide/aluminum arsenide or gallium arsenide/aluminum gallium arsenide can be converted into single crystal aluminum gallium arsenide having a higher energy gap than that of the original structure by the process of a zinc diffusion or by implantation of silicon or krypton or zinc ions. Other active devices can then be constructed in the higher energy gap material using established semiconductor processing steps.

DESCRIPTION OF THE PREFERRED EMBODIMENTS

Figure 1:
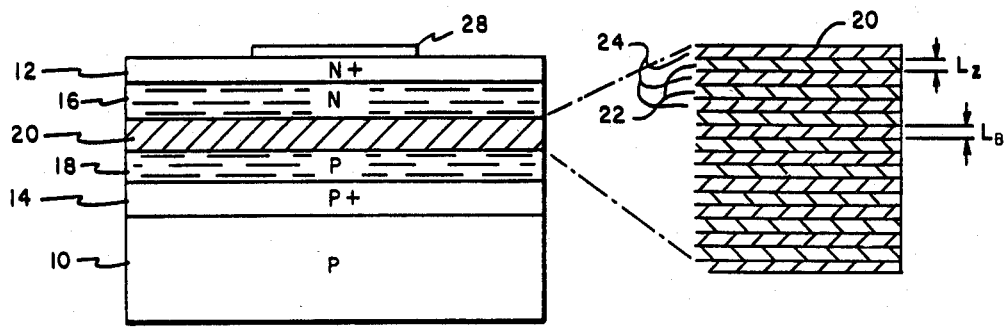
FIG. 1 is a section view of a superlattice heterostructure constructed in accordance with the teachings of co-pending U.S. patent application Ser. No. 209,240, now U.S. Pat. No. 4,439,782.

Referring now to FIG. 1, there is shown a semiconductor heterostructure device in accordance with that described in co-pending U.S. patent application Ser. No. 209,240, now U.S. Pat. No. 4,439,782. The entire device is constructed on a gallium arsenide semi-insulating or conducting substrate 10. A pair of outer buffer or contact layers 12 and 14 emcompass a pair of injecting-/collecting (i.e., injecting or collecting) regions 16 and 18, which are preferably, although not necessarily, of opposite conductivity type. A superlattice (many-layer) structure 20 is emcompassed between regions 16 and 18 which structure is shown in a blown-up view to the right of the device. Superlattice 20 comprises a plurality of interleaved lower gap, active regions 22 sandwiched between higher gap barrier layers 24.

The injecting/collecting confining regions 16 and 18 are of a relatively wide band gap semiconductor material and active layers 22 are of a relatively narrow band gap binary semiconductor material. Barrier layers 24 are of a binary semiconductor material that is lattice-matched to the active layer material 22. While not the most preferred embodiment, barrier layers 24 can also be a ternary semiconductor material which is lattice-matched to the binary active material 22.

In superlattice 20, each active layer 22 is a quantum-well having a thickness in the range of about 20 to 500 Angstroms, with the preferred thickness range being 20 to 200 Angstroms. Each barrier region 24 should have a thickness of at least about 10 Angstroms and preferably be in the range of between about 10 and 200 Angstroms. The number of active layers 22 is essentially subject to choice, but generally is in the range of 4 to 100 layers with the number of barrier regions 24 being one more in number.

An embodiment of the structure of FIG. 1 is as follows:

layer 12: 1 μm GaAs: Se (n~1×10$^{18}$cm$^{-3}$)
layer 16: 0.5-2.0 μm Al$_{0.4}$Ga$_{0.6}$As: Se (n~5×10$^{17}$cm$^{-3}$)
layers 24: (thickness=L$_B$) AlAs (doped or undoped)
layers 22: (thickness=L$_z$) GaAs (doped or undoped)
layer 18: 0.5-2.0 μm Al$_{0.4}$Ga$_{0.6}$As: Zn (p~2×10$^{17}$cm$^{-3}$)
layer 14: 1 μm GaAs: Zn (p~2×10$^{18}$cm$^{-3}$).

In a form of the invention, it has been found that the diffusion of zinc atoms into superlattice 20 can cause the superlattice to become compositionally disordered Al$_x$Ga$_{1-x}$As, with its energy gap (in one specific case) changed from about $E_g=1.61$ eV (for the gallium arsenide active layer 22) to about $E_g=2.08$ eV. (From dull red to yellow).

In order to accomplish the zinc diffusion only in desired areas, a silicon nitride mask 28 is laid down on the surface of layer 12 using well-known photolithographic processes. The exposed portions of contact region 12 are etched away, exposing the upper surface of confining layer 16. The semiconductor structure along with ZnAs$_2$ is then placed in a quartz ampoule and the combination is placed in a diffusion oven. Zinc is introduced by diffusion in the crystal in the temperature range of 500°-600° C., a temperature well below the normal cross diffusion temperature of the superlattice components (i.e., >750° C.). The diffusion time is, of course, dependent upon the device structure, but it has been found that diffusion times ranging from 10 to 60 minutes are appropriate.

The zinc atoms diffuse into the exposed regions and cause active regions 22 and barrier regions 24 in superlattice 20 to become compositionally disordered alloy Al$_x$Ga$_{1-x}$As. In other words, the various thin superlattice layers are combined in such a manner as to lose their individual identities, while maintaining the crystalline structure. If barrier regions 24 are AlAs and active regions 22 are GaAs, $x \sim L_B/(L_B+L_z)$. If the barrier regions 24 are Al$_y$Ga$_{1-y}$As, then $x \sim yL_B/(L_B+L_z)$. In this instance, y represents the fraction of barrier layer 24 that can be considered as AlAs.

Ordinarily, aluminum/gallium interdiffusion in the temperature range 500°-600° C. is negligible. It has been found, however, that when zinc is diffused, even at such a low temperature, into AlAs/GaAs superlattices, the zinc enhances the aluminum/gallium interdiffusion. Thus, at a low temperature, and in any pattern desired, the GaAs/AlAs or GaAs/Al$_x$Ga$_{1-x}$As superlattice can be fully disordered and, depending upon the GaAs layer's thickness L$_z$ and the L$_z$/L$_B$ ratio, can be increased in energy gap or even shifted, from direct gap to indirect gap.

In another form of the invention, it has been found that introduction of silicon or krypton ions, such as by implantation of silicon or krypton ions can also cause the superlattice to become compositionally disordered, while maintaining the crystalline structure. In one example, the AlAsGaAs superlattice, grown by metalorganic vapor deposition, had alternating undoped layers of GaAs (86 Angstroms) and AlAs (80 Angstroms), with 126 layers altogether for a total thickness of 1 μm. Silicon ions were implanted into the superlattice structures at room temperature at 375 keV at an angle of 7° with respect to the substrate. The ion dose was $10^{14}$ cm$^{-2}$. Some samples were subsequently annealed at 675° C. for 4 hours in an arsenic-rich atmosphere. Compositional disordering was found to result, with the energy gap, in an annealed case, for the disordered region being about $E_g=1.99$ eV, and therefore substantially higher than was exhibited by the ordered superlattice, which was about $E_g=1.57$ eV. Annealing, preferably in a temperature range of about 500° C. to 700° C., and below the temperature at which the superlattice was originally grown, appears to be an important aspect of the process in these examples. For an implanted dose of $10^{14}$ cm$^{-2}$ it appears that, before anneal, compositional disordering has not occurred and considerable crystal damage is present. After anneal at temperatures less than the original growth temperature, the damage in the implanted region is removed and compositional disordering is extensive, though not complete.

In other examples, zinc and krypton ions were implanted under similar conditions, and resulted in observable compositional disordering after annealing, although the results for the same dosages exhibited less disordering than was the case with silicon implantation.

Figure 3:
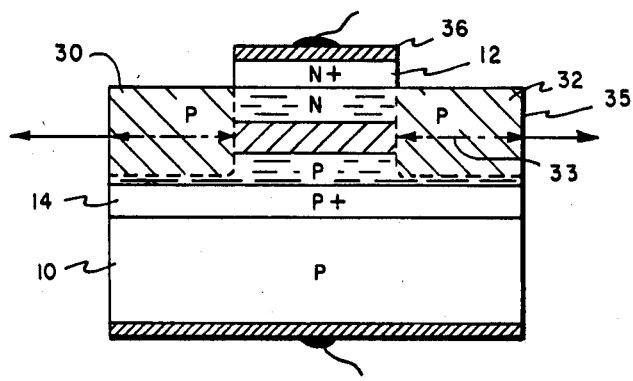
FIG. 3 is the device of FIG. 2 after the electrical contacts have been emplaced.
Figure 4:
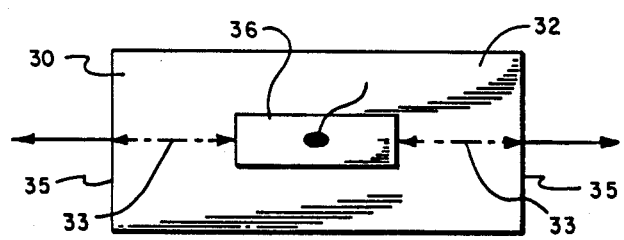
FIG. 4 is a plan view of the light emitting device of FIG. 3.

Turning now to FIG. 3, silicon nitride layer 28 has been removed and replaced by metallization layer 36. A similar layer of metallization has been applied to the underside of substrate 10 (substrate 10 being conductive in this instance) enabling a light emitting structure to be completed. A plan view of the structure is shown in FIG. 4.

When a potential is applied via contact 36 to the heterojunction laser (or if there are no contacts, the device is optically pumped), a red light is emitted by the GaAs active layers 22 along the long dimension as shown by arrows 33. Since the Al$_x$Ga$_{1-x}$As regions 30 and 32 are of a higher energy gap (orange or yellow) than the GaAs regions 22, the red light is able to pass therethrough without hindrance. Wafer edges 35 act as Fabry-Perot reflectors, creating a cavity of nonabsorbing Al$_x$Ga$_{1-x}$As for the laser. Obviously, the structure of the cavity for the heterojunction laser can be designed as desired for optimum performance characteristics. For instance, a larger cavity will provide longer photon transit times, less cavity end loss, a higher Q and a resultant lower threshold laser.

A plurality of light emitting devices such as those above described have been grown on a single substrate and then subsequently isolated by selective introduction of a disordering element, as described, to create individual devices in a monolithic environment. When a zinc diffusion or implantation is used, it creates a p region which is substantially semiconductive in its own right. By subsequently bombarding the exposed p regions with a suitable source of protons, those regions can be sufficiently damaged while still remaining single crystalline so as to create high resistivity isolating barriers between the active devices. Such bombardment does not effect the red light transmissivity of the bombarded regions.

Superlattices having active regions 22 (i.e., GaAs) as thick as 500 Angstroms ($L_z$) can be compositionally disordered as taught herein. Preferably, however, the thickness of active region 22 should be approximately 200 Angstroms or less for optimum results.

Figure 5:
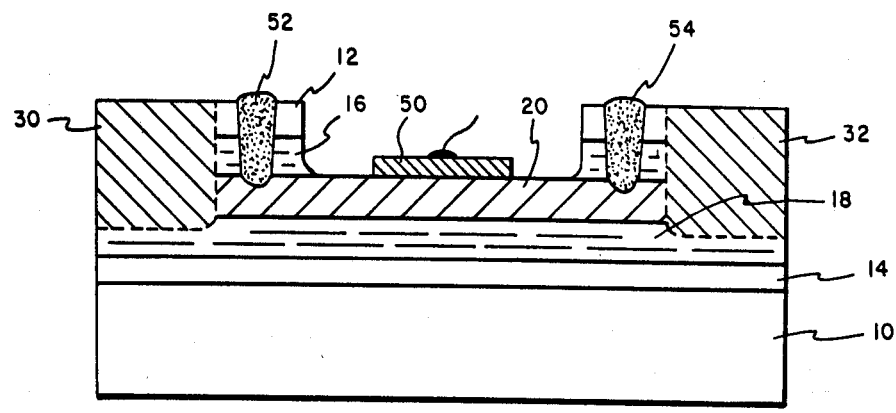
FIG. 5 is a field effect transistor constructed in accordance with the invention.

Referring now to FIG. 5, there is shown a sectional view of a Schottky barrier field effect transistor constructed employing the heterostructure configuration of FIG. 1 and isolated from other portions of the circuitry by the disordering process described above. In this instance, regions 12 and 16 have been etched away to open a channel which exposes superlattice layer 20. Metallization contact 50 has been deposited and is used as the gate electrode. N type metallizations 52 and 54 are alloyed into layers 12 and 16 and contact superlattice layer 20. These provide the source and drain contacts for the device. The device of FIG. 5 is illustrated to show the versatility of the selective disordering technique hereof in that a plurality of devices can be integrated into a single monolithic chip and then isolated by the higher gap disordered regions—which are later converted to higher resistivity, if necessary, by proton bombardment. Obviously, additional active devices can be constructed in the disordered regions, if such are desired.

The method of constructing the Schottky barrier device shown in FIG. 5 is conventional in that layer 20 can be high mobility modulation doped, i.e., a donor grown into the barriers but none in the adjacent regions (i.e., GaAs). Layers 12 and 16 are selectively etched away after the upper surface of the device is suitably masked. The last step involves the alloying of junction contact 52 and 54, again after suitable masking.

Figure 2:
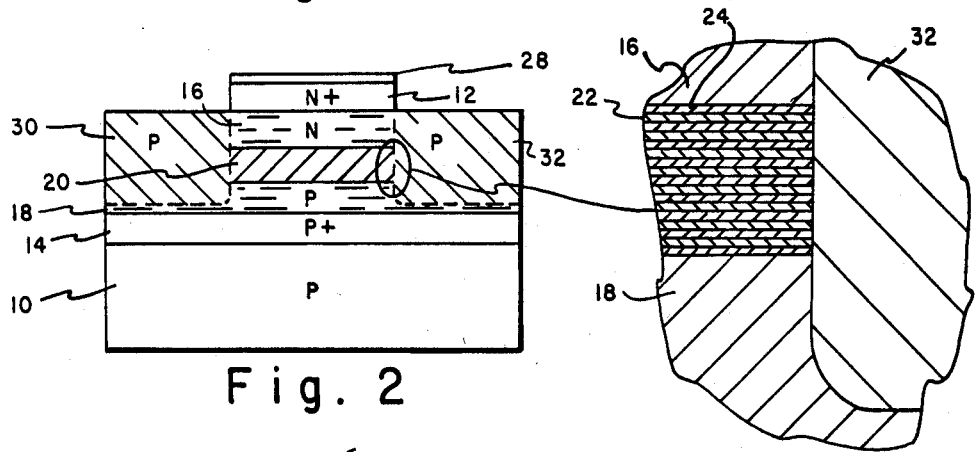
FIG. 2 is the structure of FIG. 1 after selective disordering and additional processing.
Figure 6:
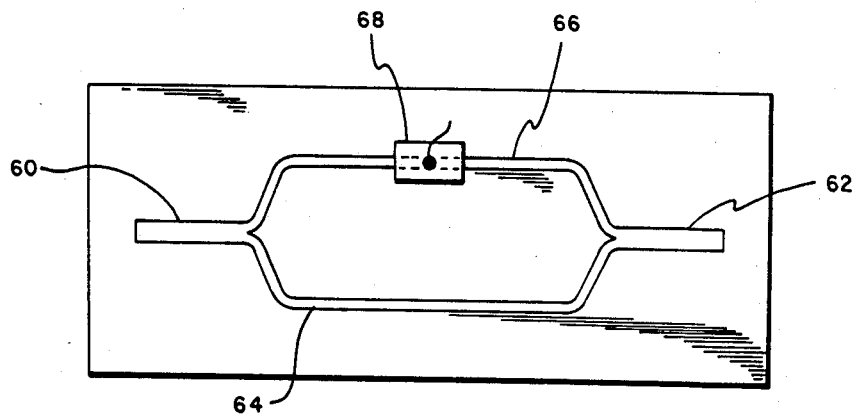
FIG. 6 is a plan view of an integrated optical processing device.

Referring now to FIG. 6, there is shown a plan view of an integrated structure constructed in accordance with the invention. In this instance, however, contact layer 12 and confining layer 16 over the superlattice layer have been removed to show an integrated laser/waveguide structure. Laser active regions 60 and 62 are constructed identically to that shown in FIGS. 2-3, except that each terminates in a pair of superlattice waveguides 64 and 66. A metal contact 68 (similar to that shown in FIG. 5) overlays waveguide 66 and is reverse (or even forward) biased to provide a Schottky barrier junction between itself and underlying superlattice 66. The individual devices have been isolated by selective disordering as described above.

Laser 60 is biased in such a mode as to generate light; however, laser 62 is biased sufficiently below threshold that it can be optically pumped by in-phase radiation travelling along superlattice waveguides 64 and 66. Due to fact that the lower gap material (red) exhibits a higher index of refraction than the yellow material, the emitted red light tends to stay within the lower gap material making up waveguides 64 and 66 (so long as there are no abrupt changes of direction of the waveguide materials). By properly energizing contact 68, a retarding electro-optic effect can be achieved which will alter the phase of the signal on waveguide 66 so as to create an out-of-phase signal at the juncture feeding laser 62. Under these conditions, laser 62 is inhibited from lasing. If contact 68 is not energized, in phase optical pumping enables laser 62 to lase, thereby providing an electro-optic logic device.

In summary it has been found that superlattice layers can be disordered and shifted up in energy gap, while remaining single crystal, by introduction of a disordering element, such as by diffusion or implantation. This enables the production of integrated electro-optical and semiconductor devices through a disordering/isolation process.

While the invention has been shown in regard to a number of specific embodiments, it should be understood that a number of alterations may be contemplated, among which are: the doping in every instance can be inverted (from p to n and n to p); and/or all superlattice regions can be either doped or undoped and/or the substrate can be semi-insulating, etc.

I claim:
1. A semiconductor device, comprising;
a semiconductor support layer;
a disordered alloy converted from at least a first active semiconductor region and a second semiconductor barrier layer that have been disordered by introduction of a disordering element selected from the group consisting of silicon and krypton such that the alloy exhibits a higher energy gap than the first active semiconductor region.
2. The device as defined by claim 1, wherein said at least first active semiconductor region and second semiconductor barrier layer that have been disordered comprises a superlattice of said layers.
3. The device as defined by claim 1, wherein said first active layer is sufficiently thin to exhibit quantum size effects.
4. The device as defined by claim 2, wherein said first active layers are sufficiently thin to exhibit quantum size effects.
5. The device as defined by claim 3, wherein said first and second semiconductors are III–V semiconductors.
6. The device as defined by claim 4, wherein said first and second semiconductors are III–V semiconductors.
7. The device as defined by claim 5, wherein said first active semiconducting region is gallium arsenide and said second semiconductor barrier layer is aluminum arsenide.
8. The device as defined by claim 6, wherein said first active semiconducting region is gallium arsenide and said second semiconductor barrier is aluminum arsenide.
9. The device as defined by claim 5, wherein said first active semiconducting region is gallium arsenide and said second semiconductor barrier layer is aluminum gallium arsenide.
10. The device as defined by claim 6, wherein said first active semiconducting region is gallium arsenide and said second semiconductor barrier layer is aluminum gallium arsenide.

* * * * *